(12) United States Patent
Peng et al.

(10) Patent No.: US 12,250,006 B2
(45) Date of Patent: Mar. 11, 2025

(54) DECODER FOR DECODING DATA IN A PAM-2M FORMAT, DECODER DEVICE USING THE DECODER, AND RECEIVER USING THE DECODER DEVICE

(71) Applicant: NATIONAL TSING HUA UNIVERSITY, Hsinchu (TW)

(72) Inventors: Pen-Jui Peng, Hsinchu (TW); Yen-Po Lin, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 188 days.

(21) Appl. No.: 18/311,940

(22) Filed: May 4, 2023

(65) Prior Publication Data
US 2024/0372561 A1     Nov. 7, 2024

(51) Int. Cl.
*H03M 7/14*    (2006.01)

(52) U.S. Cl.
CPC ..................... *H03M 7/14* (2013.01)

(58) Field of Classification Search
CPC .................. H03M 7/14; H03M 1/00
See application file for complete search history.

(56) References Cited

U.S. PATENT DOCUMENTS

| | | | | |
|---|---|---|---|---|
| 7,535,962 B1 * | 5/2009 | Black | ................. | H04L 7/04 341/60 |
| 7,778,286 B2 * | 8/2010 | Agazzi | ............. | H04L 25/03006 341/155 |
| 7,835,389 B2 * | 11/2010 | Yu | ................. | H04L 25/4923 341/51 |
| 8,649,445 B2 * | 2/2014 | Cronie | ............... | H04L 25/4908 331/25 |
| 11,075,786 B1 * | 7/2021 | Shattil | ................ | H04L 5/0007 |
| 2006/0215709 A1 * | 9/2006 | Kuwata | .............. | H04L 25/4902 370/535 |
| 2010/0097254 A1 * | 4/2010 | Huang | ................ | H02M 3/157 341/142 |
| 2016/0126970 A1 * | 5/2016 | Xu | ................. | H03M 1/1061 341/120 |
| 2018/0091335 A1 * | 3/2018 | Schnizler | ........... | H04L 25/4917 |
| 2021/0067312 A1 * | 3/2021 | Kawasoe | ............ | H03L 7/091 |

(Continued)

OTHER PUBLICATIONS

Pen-Jui Peng et al., "A 56Gb/s PAM-4/NRZ transceiver in 40nm CMOS," IEEE International Solid-State Circuits Conference (ISSCC), pp. 110-112, 2017.

*Primary Examiner* — Lam T Mai
(74) *Attorney, Agent, or Firm* — Birch, Stewart, Kolasch & Birch, LLP

(57) ABSTRACT

A decoder includes a demultiplexer and a number (P) of ADCs, where P≥2. The demultiplexer receives a to-be-decoded data signal that is in a PAM-$2^M$ format, and demultiplexes the to-be decoded data signal into a number (P) of demultiplexed data signals, where M≥2. The ADCs respectively receive the demultiplexed data signals. One of the ADCs is an (M+1)-bit ADC, and converts the corresponding demultiplexed data signal into a digital first decoded signal that contains an M-bits wide data portion and a one-bit wide error portion. Each of the other one(s) of the ADCs is an M-bit ADC, and converts the corresponding demultiplexed data signal into a digital second decoded signal that contains an M-bits wide data portion.

15 Claims, 2 Drawing Sheets

(56) References Cited

U.S. PATENT DOCUMENTS

| | | | |
|---|---|---|---|
| 2022/0140837 A1* | 5/2022 | Xu | H03M 1/121 341/161 |
| 2023/0093114 A1* | 3/2023 | Bartling | H03M 1/0624 341/155 |
| 2023/0253974 A1* | 8/2023 | Hossain | H03M 1/002 341/142 |

* cited by examiner

DECODER FOR DECODING DATA IN A PAM-2M FORMAT, DECODER DEVICE USING THE DECODER, AND RECEIVER USING THE DECODER DEVICE

FIELD

The disclosure relates to data decoding, and more particularly to a decoder for decoding data in a pulse amplitude modulation (PAM)-$2^M$ format, a decoder device using the decoder, and a receiver using the decoder device.

BACKGROUND

The Serializer/Deserializer (SerDes) function is widely used in communication standards (e.g., Ethernet, peripheral component interconnect express (PCIe), universal serial bus (USB), etc.) and extra-short reach (XSR) applications (e.g., package-to-package computing chips, optical communication chips, etc.). It is important that a receiver for converting serial input data into parallel output data has enhanced performance and reduced power consumption.

SUMMARY

Therefore, an object of the disclosure is to provide a decoder for decoding data in a pulse amplitude modulation (PAM)-$2^M$ format, a decoder device using the decoder, and a receiver using the decoder device. The receiver can have enhanced performance and reduced power consumption simultaneously.

According to an aspect of the disclosure, the decoder includes a demultiplexer and a number (P) of analog to digital converters (ADCs), where P≥2. The demultiplexer receives a to-be-decoded data signal that is in a PAM-$2^M$ format, and demultiplexes the to-be decoded data signal into a number (P) of demultiplexed data signals, where M≥2. Each of the ADCs is connected to the demultiplexer to receive a respective one of the demultiplexed data signals. One of the ADCs is an (M+1)-bit ADC, and performs analog to digital conversion on the respective one of the demultiplexed data signals to generate a first decoded signal containing a data portion that is M-bits wide and an error portion that is one-bit wide. Each of the other one(s) of the ADCs is an M-bit ADC, and performs analog to digital conversion on the respective one of the demultiplexed data signals to generate a second decoded signal containing a data portion that is M-bits wide.

According to another aspect of the disclosure, the decoder device includes a number (N) of decoders, where N≥2. Each of the decoders includes a first demultiplexer, a buffer, a second demultiplexer and a number (P) of ADCs, where P≥2. The first demultiplexers of the decoders cooperate with each other to receive a feed-in data signal that is in a PAM-$2^M$ format, and to demultiplex the feed-in data signal into a number (N) of first demultiplexed data signals that are respectively outputted by the first demultiplexers, where M≥2. For each of the decoders, the buffer is connected to the first demultiplexer to receive the first demultiplexed data signal outputted by the first demultiplexer, and buffers the first demultiplexed data signal to generate a to-be-decoded data signal; the second demultiplexer is connected to the buffer to receive the to-be-decoded data signal, and demultiplexes the to-be decoded data signal into a number (P) of second demultiplexed data signals; each of the ADCs is connected to the second demultiplexer to receive a respective one of the second demultiplexed data signals; one of the ADCs is an (M+1)-bit ADC, and performs analog to digital conversion on the respective one of the second demultiplexed data signals to generate a first decoded signal containing a data portion that is M-bits wide and an error portion that is one-bit wide; and each of the other one(s) of the ADCs is an M-bit ADC, and performs analog to digital conversion on the respective one of the second demultiplexed data signals to generate a second decoded signal containing a data portion that is M-bits wide.

According to yet another aspect of the disclosure, the receiver includes a channel compensator, a voltage regulator, a phase interpolator, a decoder device and an adaptive controller. The channel compensator receives an input data signal that is in a PAM-$2^M$ format, and performs channel compensation on the input data signal to generate a feed-in data signal, where M≥2 and a gain of the channel compensator is adjustable. The voltage regulator generates a reference voltage, a magnitude of which is adjustable. The phase interpolator receives a clock input, and performs phase interpolation on the clock input to generate a number (N) of interpolated clock signals, where N≥2 and a phase shift of each of the interpolated clock signals with respect to the clock input is adjustable. The decoder device includes a number (N) of decoders. Each of the decoders includes a deskewer, a first demultiplexer, a buffer, a second demultiplexer and a number (P) of ADCs, where P≥2. For each of the decoders, the deskewer is connected to the phase interpolator to receive a respective one of the interpolated clock signals, and delays the respective one of the interpolated clock signals to generate a deskewed clock signal, where a delay of the deskewed clock signal with respect to the respective one of the interpolated clock signals is adjustable; and the first demultiplexer is connected to the deskewer to receive the deskewed clock signal, and is further connected to the channel compensator. The first demultiplexers of the decoders cooperate with each other to receive the feed-in data signal from the channel compensator, and to demultiplex, based on the deskewed clock signals generated by the deskewers of the decoders, the feed-in data signal into a number (N) of first demultiplexed data signals that are respectively outputted by the first demultiplexers. For each of the decoders, the buffer is connected to the first demultiplexer to receive the first demultiplexed data signal outputted by the first demultiplexer, and buffers the first demultiplexed data signal to generate a to-be-decoded data signal; the second demultiplexer is connected to the buffer to receive the to-be-decoded data signal, and demultiplexes the to-be decoded data signal into a number (P) of second demultiplexed data signals; each of the ADCs is connected to the second demultiplexer to receive a respective one of the second demultiplexed data signals, and is further connected to the voltage regulator to receive the reference voltage; one of the ADCs is an (M+1)-bit ADC, and performs analog to digital conversion on the respective one of the second demultiplexed data signals based on the reference voltage to generate a first decoded signal containing a data portion that is M-bits wide and an error portion that is one-bit wide; and each of the other one(s) of the ADCs is an M-bit ADC, and performs analog to digital conversion on the respective one of the second demultiplexed data signals based on the reference voltage to generate a second decoded signal containing a data portion that is M-bits wide. The adaptive controller is connected to the decoder device to receive a decoded output that originates from the first and second decoded signals generated by the ADCs of the decoders, and is further connected to the channel compensator, the voltage regulator, the phase interpolator and the deskewers of the decoders. The adaptive controller generates an output data signal based on a data portion of the decoded output that originates from the data portions of the first and second decoded signals, and performs adaptive calibration on the channel compensator, the voltage regulator, the phase interpolator and the deskewers of the decoders to adjust the gain of the channel compensator, the magnitude of the reference voltage, the phase shift of each of the interpolated clock signals and the delay of each of the deskewed clock signals based on an error portion of the decoded output that originates from the error portions of the first decoded signals.

BRIEF DESCRIPTION OF THE DRAWINGS

Other features and advantages of the disclosure will become apparent in the following detailed description of the embodiment(s) with reference to the accompanying drawings. It is noted that various features may not be drawn to scale.

DETAILED DESCRIPTION

Figure 1:
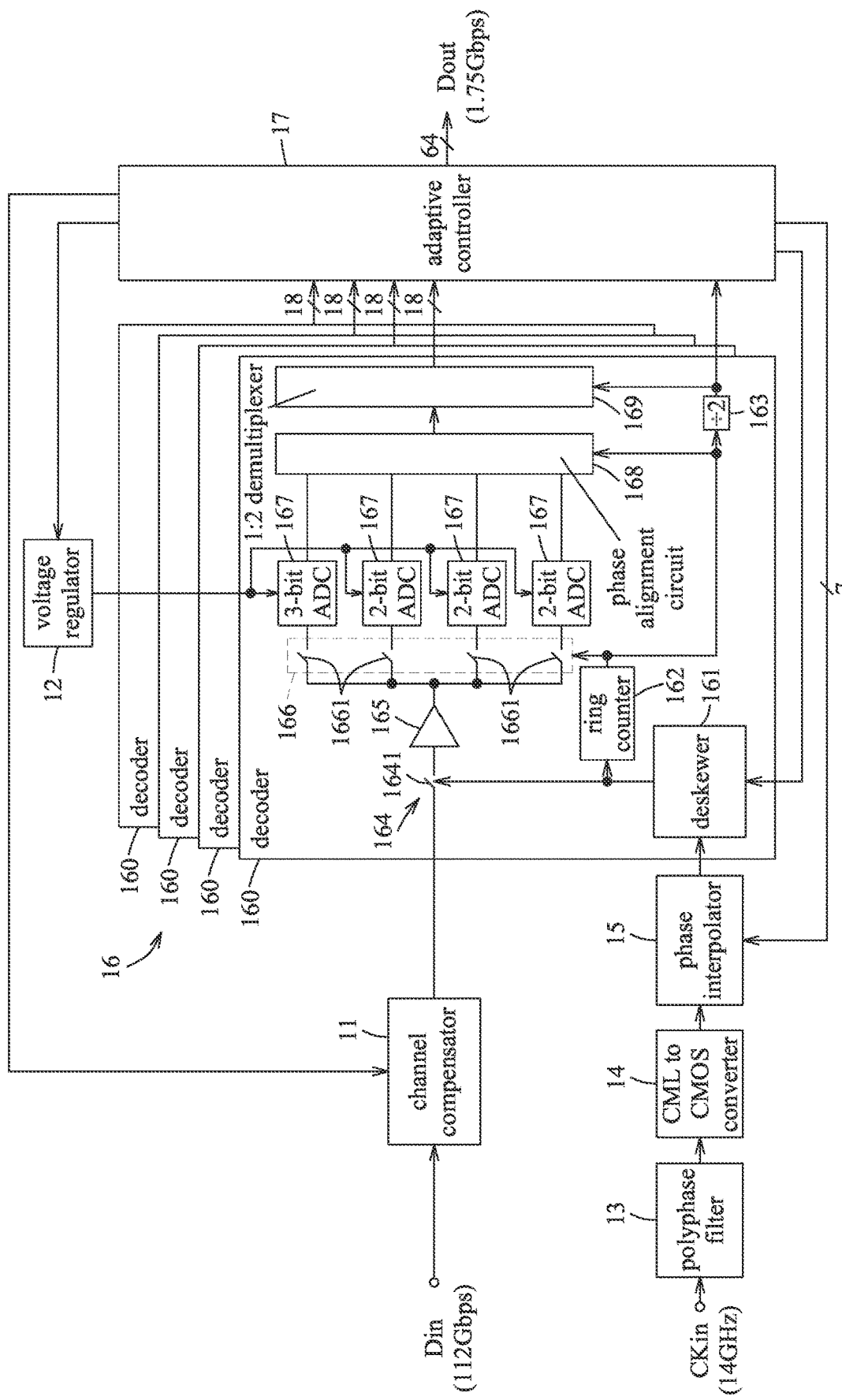
FIG. 1 is a circuit block diagram illustrating an embodiment of a receiver according to the disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
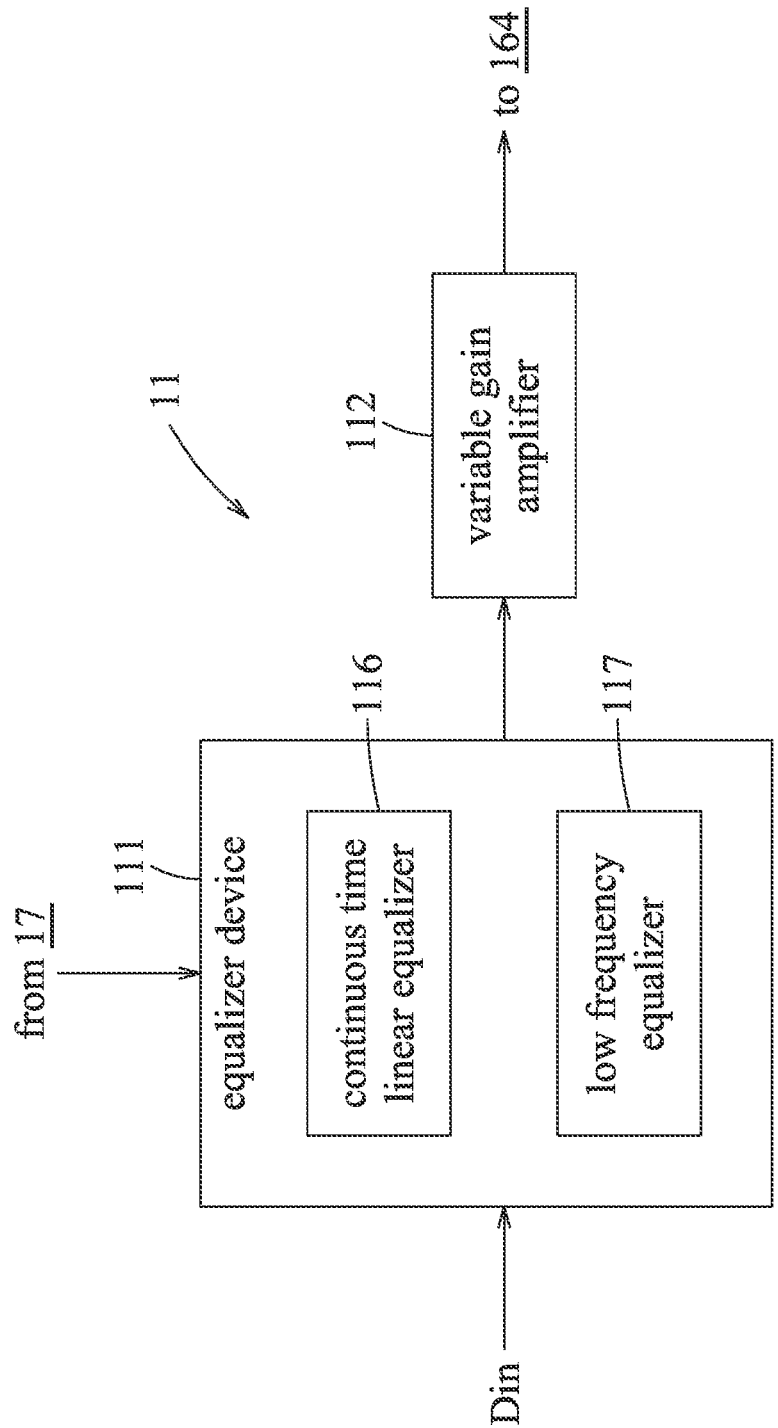
FIG. 2 is a block diagram illustrating a channel compensator of the embodiment.

Referring to FIGS. 1 and 2, an embodiment of a receiver according to the disclosure is for converting serial input data into parallel output data, and includes a channel compensator 11, a voltage regulator 12, a polyphase filter 13, a current mode logic (CML) to complementary metal oxide semiconductor (CMOS) converter 14, a phase interpolator 15, a decoder device 16 and an adaptive controller 17.

The channel compensator 11 receives an input data signal (Din) that is in a pulse amplitude modulation (PAM)-$2^M$ format, and performs channel compensation on the input data signal (Din) to generate a feed-in data signal in the PAM-$2^M$ format, where M≥2 and a gain of the channel compensator 11 is adjustable. For illustration purposes, in this embodiment, each of the input data signal (Din) and the feed-in data signal is in a PAM-4 format (i.e., M=2), and has a data rate of 112 Gbps (i.e., 56 Gbaud).

In this embodiment, the channel compensator 11 includes an equalizer device 111 and a variable gain amplifier (VGA) 112. The equalizer device 111 includes a continuous time linear equalizer (CTLE) 116 and a low frequency equalizer (LFEQ) 117. High frequency components of the input data signal (Din) are compensated by the continuous time linear equalizer 116, medium and low frequency components of the input data signal (Din) are compensated by the low frequency equalizer 117, and a resultant signal from the aforesaid compensations is adjusted by the variable gain amplifier 112 in pulse amplitude, so as to generate the feed-in data signal. Parameters of the continuous time linear equalizer 116 and the low frequency equalizer 117 can be adjusted to change the gain of the channel compensator 11.

The voltage regulator 12 generates a reference voltage having a magnitude that is adjustable.

The polyphase filter 13 receives a differential input clock signal pair (CKin) of a CML level, and splits the differential input clock signal pair (CKin) into two differential first clock signal pairs that are of a CML level and that are 90 degrees out of phase. For illustration purposes, in this embodiment, the differential input clock signal pair (CKin) has a frequency of 14 GHZ.

The CML to CMOS converter 14 is connected to the polyphase filter 13 to receive the differential first clock signal pairs, and converts the differential first clock signal pairs respectively into two differential second clock signal pairs of a CMOS level.

The phase interpolator 15 cooperates with some components of the adaptive controller 17 to constitute a clock data recovery (CDR) circuit. The phase interpolator 15 is connected to the CML to CMOS converter 14 to receive the differential second clock signal pairs that cooperatively constitute a clock input, and performs phase interpolation on the clock input to generate a number (N) of interpolated clock signals, where N≥2. A phase shift of each of the interpolated clock signals with respect to the clock input is adjustable. For illustration purposes, in this embodiment, four interpolated clock signals are generated (i.e., N=4).

The decoder device 16 includes a number (N) of decoders 160 (i.e., there are four decoders 160 in this embodiment). In this embodiment, each of the decoders 160 includes a deskewer 161, a ring counter 162, a 1/Q divider 163, a first demultiplexer 164, a buffer 165, a second demultiplexer 166, a number (P) of analog to digital converters (ADCs) 167, a phase alignment circuit 168 and a 1:Q demultiplexer 169, where P≥2 and Q≥2. For illustration purposes, in this embodiment, a ½ divider 163, four ADCs 167 and a 1:2 demultiplexer 169 are used (i.e., P=4 and Q=2).

For each of the decoders 160, the deskewer 161 is connected to the phase interpolator 15 to receive a respective one of the interpolated clock signals, and delays the respective one of the interpolated clock signals to generate a deskewed clock signal. The delay of the deskewed clock signal with respect to the respective one of the interpolated clock signals is adjustable. The first demultiplexer 164 is connected to the deskewer 161 to receive the deskewed clock signal, and is further connected to the channel compensator 11.

The first demultiplexers 164 of the decoders 160 cooperate with each other to receive the feed-in data signal from the channel compensator 11, and to demultiplex, based on the deskewed clock signals generated by the deskewers 161 of the decoders 160, the feed-in data signal into a number (N) of first demultiplexed data signals (i.e., there are four first demultiplexed data signals in this embodiment) that are respectively outputted by the first demultiplexers 164. In this embodiment, each of the first demultiplexed data signals has a data rate of 14 Gbaud.

It should be noted that, for each of the deskewed clock signals, by adjusting the delay of the deskewed clock signal, a skew that is between the deskewed clock signal and any one of the other one(s) of the deskewed clock signals can be changed.

In this embodiment, for each of the decoders 160, the first demultiplexer 164 includes a sampling switch 1641. The sampling switch 1641 has a first terminal that is connected to the channel compensator 11 to receive the feed-in data signal, a second terminal that provides the corresponding one of the first demultiplexed data signals, and a control terminal that is connected to the deskewer 161 to receive the deskewed clock signal. The sampling switch 1641 switches between conduction and non-conduction based on the deskewed clock signal. When the sampling switch 1641 conducts, the feed-in data signal is transmitted through the sampling switch 1641 to serve as the corresponding one of the first demultiplexed data signals.

For each of the decoders 160, the ring counter 162 is connected to the deskewer 161 to receive the deskewed clock signal, and generates, based on the deskewed clock signal, a counting output that is P-bits wide (i.e., four-bits wide in this embodiment). A predetermined logic value (e.g., logic value "1") circulates around the bits of the counting output at the pace defined by the deskewed clock signal. The 1/Q divider 163 (i.e., the ½ divider 163 in this embodiment) is connected to the ring counter 162 to receive the counting output, and generates, based on the counting output, a third clock signal having a frequency that is 1/Q (i.e., ½ in this embodiment) of a frequency of the counting output.

For each of the decoders 160, the buffer 165 is connected to the second terminal of the sampling switch 1641 to receive the first demultiplexed data signal, and buffers the first demultiplexed data signal to generate a to-be-decoded data signal in the PAM-$2^M$ format (i.e., the PAM-4 format in this embodiment). The second demultiplexer 166 is connected to the buffer 165 to receive the to-be-decoded data signal, is further connected to the ring counter 162 to receive the counting output, and demultiplexes the to-be decoded data signal into a number (P) of second demultiplexed data signals (i.e., four second demultiplexed data signals in this embodiment) based on the counting output. Each of the ADCs 167 is connected to the second demultiplexer 166 to receive a respective one of the second demultiplexed data signals, and is further connected to the voltage regulator 12 to receive the reference voltage. One of the ADCs 167 is an (M+1)-bit ADC (i.e., a three-bit ADC in this embodiment), and performs analog to digital conversion on the respective one of the second demultiplexed data signals based on the reference voltage to generate a first decoded signal in a non-return-to-zero (NRZ) format. The first decoded signal contains a data portion that is M-bits wide (i.e., two-bits wide in this embodiment) and an error portion that is one-bit wide. Each of the other one(s) of the ADCs 167 is an M-bit ADC (i.e., a two-bit ADC in this embodiment), and performs analog to digital conversion on the respective one of the second demultiplexed data signals based on the reference voltage to generate a second decoded signal in the NRZ format. The second decoded signal contains a data portion that is M-bits wide (i.e., two-bits wide in this embodiment). In this embodiment, each of the second demultiplexed data signals has a data rate of 3.5 Gbaud.

In this embodiment, for each of the decoders 160, the second demultiplexer 166 includes a number (P) of sampling switches 1661 (i.e., there are four sampling switches 1661 in this embodiment). Each of the sampling switches 1661 has a first terminal that is connected to the buffer 165 to receive the to-be-decoded data signal, a second terminal that provides a respective one of the second demultiplexed data signals, and a control terminal that is connected to the ring counter 162 to receive a respective one of the bits of the counting output. Each of the sampling switches 1661 conducts when the respective one of the bits of the counting output is at the predetermined logic value (i.e., the logic value "1" in this embodiment), and does not conduct when otherwise. For each of the sampling switches 1661, when the sampling switch 1661 conducts, the feed-in-data signal is transmitted through the sampling switch 1661 to serve as the respective one of the second demultiplexed data signals. In addition, each of the ADCs 167 is a successive approximation ADC.

For each of the decoders 160, the phase alignment circuit 168 is connected to the ADCs 167 to receive the first and second decoded signals, is further connected to the ring counter 162 to receive the counting output, and aligns the first and second decoded signals based on the counting output to generate an aligned signal that contains a data portion and an error portion. The data portion of the aligned signal is (M×P)-bits wide (i.e., eight-bits wide in this embodiment), and originates from the data portions of the first and second decoded signals. The error portion of the aligned signal is one-bit wide, and originates from the error portion of the first decoded signal. The 1:Q demultiplexer 169 (i.e., the 1:2 demultiplexer 169 in this embodiment) is connected to the phase alignment circuit 168 to receive the aligned signal, is further connected to the 1/Q divider 163 (i.e., the ½ divider 163 in this embodiment) to receive the third clock signal, and demultiplexes, based on the third clock signal, the aligned signal into a demultiplexed signal that contains a data portion and an error portion. The data portion of the demultiplexed signal is (M×P×Q)-bits wide (i.e., sixteen-bits wide in this embodiment), and originates from the data portions of the first and second decoded signals. The error portion of the demultiplexed signal is Q-bits wide (i.e., two-bits wide in this embodiment), and originates from the error portion of the first decoded signal. The demultiplexed signals generated by the 1:Q demultiplexers 169 (i.e., the 1:2 demultiplexers 169 in this embodiment) of the decoders 160 cooperatively constitute a decoded output. In this embodiment, for each of the decoders 160, the aligned signal has a data rate of 8×3.5 Gbps for the data portion thereof and a data rate of 1×3.5 Gbps for the error portion thereof, and the demultiplexed signal has a data rate of 16×1.75 Gbps for the data portion thereof and a data rate of 2×1.75 Gbps for the error portion thereof.

The adaptive controller 17 is connected to the 1:Q demultiplexers 169 (i.e., the 1:2 demultiplexers 169 in this embodiment) of the decoders 160 to receive the decoded output, is further connected to the equalizer device 111, the voltage regulator 12, the phase interpolator 15 and the deskewers 161 of the decoders 160, and generates an output data signal (Dout) based on a data portion of the decoded output that originates from the data portions of the first and second decoded signals generated by the ADCs 167 of the decoders 160. The adaptive controller 17 further performs adaptive calibration on the equalizer device 111, the voltage regulator 12, the phase interpolator 13 and the deskewers 161 of the decoders 160 to adjust the gain of the channel compensator 11, the magnitude of the reference voltage, the phase shift of each of the interpolated clock signals and the delay of each of the deskewed clock signals based on an error portion of the decoded output that originates from the error portions of the first decoded signals, so as to obtain optimal quality of the feed-in data signal's eye diagram, a correct swing of the feed-in data signal, and optimal sample positions of the feed-in data signal. In this embodiment, the output data signal (Dout) has a data rate of 64×1.75 Gbps.

In view of the above, the receiver of this embodiment has the following advantages.

1. The continuous time linear equalizer 116 is only used to compensate the high frequency components of the input data signal (Din), so the receiver is suitable for operating under a circumstance where the input data signal (Din) is transmitted through a low loss channel. In addition, the ADCs 167 of the decoders 160 are each a successive approximation ADC, and operate in a time interleaved manner because of the first and second demultiplexers 164, 166 of the decoders 160. These are beneficial for reducing power consumption of the decoder device 16.

2. For each of the decoders 160, only one of the ADCs 167 is an (M+1)-bit ADC (i.e., a three-bit ADC in this embodiment) that extracts error terms respectively corresponding to a number (2) of data values (i.e., four data values in this embodiment) of the data portion of the first decoded signal for use in adaptive calibration performed on the equalizer device 111 and the phase interpolator 15. This can attain acceptable jitter tolerance of the clock data recovery circuit, enhance performance of the receiver, and reduce power consumption of the receiver.

3. The voltage regulator 12 generates a reference voltage for use by all of the ADCs 167 of the decoders 160, which is beneficial for reducing the size and power consumption of the voltage regulator 12.

4. By virtue of the buffer 165 connected between the first demultiplexer 164 and the second demultiplexer 166 in each of the decoders 160, the channel compensator 11 has a light load capacitance at its output terminal and thus a wide bandwidth.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects; such does not mean that every one of these features needs to be practiced with the presence of all the other features. In other words, in any described embodiment, when implementation of one or more features or specific details does not affect implementation of another one or more features or specific details, said one or more features may be singled out and practiced alone without said another one or more features or specific details. It should be further noted that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. A decoder comprising:
a demultiplexer receiving a to-be-decoded data signal that is in a pulse amplitude modulation (PAM)-$2^M$ format, and demultiplexing the to-be decoded data signal into a number (P) of demultiplexed data signals, where M≥2 and P≥2; and
a number (P) of analog to digital converters (ADCs), each of which is connected to said demultiplexer to receive a respective one of the demultiplexed data signals;
wherein one of said ADCs is an (M+1)-bit ADC, and performs analog to digital conversion on the respective one of the demultiplexed data signals to generate a first decoded signal containing a data portion that is M-bits wide and an error portion that is one-bit wide; and
wherein each of the other one(s) of said ADCs is an M-bit ADC, and performs analog to digital conversion on the respective one of the demultiplexed data signals to generate a second decoded signal containing a data portion that is M-bits wide.

2. The decoder as claimed in claim 1, wherein:
said demultiplexer includes a number (P) of sampling switches; and
each of said sampling switches has a first terminal that receives the to-be-decoded data signal, and a second terminal that is connected to a respective one of said ADCs and that provides a respective one of the demultiplexed data signals.

3. The decoder as claimed in claim 1, wherein each of said ADCs is a successive approximation ADC.

4. A decoder device comprising:
a number (N) of decoders, each of which includes a first demultiplexer, a buffer, a second demultiplexer and a number (P) of analog to digital converters (ADCs), where N≥2 and P≥2;
said first demultiplexers of said decoders cooperating with each other to receive a feed-in data signal that is in a pulse amplitude modulation (PAM)-$2^M$ format, and to demultiplex the feed-in data signal into a number (N) of first demultiplexed data signals that are respectively outputted by said first demultiplexers, where M≥2;
for each of said decoders,
said buffer being connected to said first demultiplexer to receive the first demultiplexed data signal outputted by said first demultiplexer, and buffering the first demultiplexed data signal to generate a to-be-decoded data signal,
said second demultiplexer being connected to said buffer to receive the to-be-decoded data signal, and demultiplexing the to-be decoded data signal into a number (P) of second demultiplexed data signals,
each of said ADCs being connected to said second demultiplexer to receive a respective one of the second demultiplexed data signals,
one of said ADCs being an (M+1)-bit ADC, and performing analog to digital conversion on the respective one of the second demultiplexed data signals to generate a first decoded signal containing a data portion that is M-bits wide and an error portion that is one-bit wide, and
each of the other one(s) of said ADCs being an M-bit ADC, and performing analog to digital conversion on the respective one of the second demultiplexed data signals to generate a second decoded signal containing a data portion that is M-bit wide.

5. The decoder device as claimed in claim 4, wherein, for each of said decoders:
said second demultiplexer includes a number (P) of sampling switches; and
each of said sampling switches has a first terminal that is connected to said buffer to receive the to-be-decoded data signal, and a second terminal that is connected to a respective one of said ADCs and that provides a respective one of the second demultiplexed data signals.

6. The decoder device as claimed in claim 4, wherein each of said ADCs of said decoders is a successive approximation ADC.

7. The decoder device as claimed in claim 4, wherein, for each of said decoders:

said first demultiplexer includes a sampling switch; and
said sampling switch has a first terminal that receives the feed-in data signal, and a second terminal that is connected to said buffer and that provides the corresponding one of the first demultiplexed data signals.

8. The decoder device as claimed in claim 4, wherein each of said decoders further includes:
a phase alignment circuit connected to said ADCs to receive the first and second decoded signals, and aligning the first and second decoded signals to generate an aligned signal containing a data portion that is (M×P)-bits wide and an error portion that is one-bit wide.

9. The decoder device as claimed in claim 8, wherein each of said decoders further includes:
a 1:Q demultiplexer connected to said phase alignment circuit to receive the aligned signal, and demultiplexing the aligned signal into a demultiplexed signal containing a data portion that is (M×P×Q)-bits wide and an error portion that is Q-bits wide, where Q≥2.

10. A receiver comprising:
a channel compensator receiving an input data signal that is in a pulse amplitude modulation (PAM)-$2^M$ format, and performing channel compensation on the input data signal to generate a feed-in data signal, where M≥2 and a gain of said channel compensator is adjustable;
a voltage regulator generating a reference voltage, a magnitude of which is adjustable;
a phase interpolator receiving a clock input, and performing phase interpolation on the clock input to generate a number (N) of interpolated clock signals, where N≥2 and a phase shift of each of the interpolated clock signals with respect to the clock input is adjustable;
a decoder device including a number (N) of decoders, each of which includes a deskewer, a first demultiplexer, a buffer, a second demultiplexer and a number (P) of analog to digital converters (ADCs), where P≥2;
for each of said decoders,
said deskewer being connected to said phase interpolator to receive a respective one of the interpolated clock signals, and delaying the respective one of the interpolated clock signals to generate a deskewed clock signal, where a delay of the deskewed clock signal with respect to the respective one of the interpolated clock signals is adjustable, and
said first demultiplexer being connected to said deskewer to receive the deskewed clock signal, and being further connected to said channel compensator;
said first demultiplexers of said decoders cooperating with each other to receive the feed-in data signal from said channel compensator, and to demultiplex, based on the deskewed clock signals generated by said deskewers of said decoders, the feed-in data signal into a number (N) of first demultiplexed data signals that are respectively outputted by said first demultiplexers;
for each of said decoders,
said buffer being connected to said first demultiplexer to receive the first demultiplexed data signal outputted by said first demultiplexer, and buffering the first demultiplexed data signal to generate a to-be-decoded data signal,
said second demultiplexer being connected to said buffer to receive the to-be-decoded data signal, and demultiplexing the to-be decoded data signal into a number (P) of second demultiplexed data signals,
each of said ADCs being connected to said second demultiplexer to receive a respective one of the second demultiplexed data signals, and being further connected to said voltage regulator to receive the reference voltage,
one of said ADCs being an (M+1)-bit ADC, and performing analog to digital conversion on the respective one of the second demultiplexed data signals based on the reference voltage to generate a first decoded signal containing a data portion that is M-bit wide and an error portion that is one-bit wide, and
each of the other one(s) of said ADCs being an M-bit ADC, and performing analog to digital conversion on the respective one of the second demultiplexed data signals based on the reference voltage to generate a second decoded signal containing a data portion that is M-bits wide; and
an adaptive controller connected to said decoder device to receive a decoded output that originates from the first and second decoded signals generated by said ADCs of said decoders, and further connected to said channel compensator, said voltage regulator, said phase interpolator and said deskewers of said decoders;
said adaptive controller generating an output data signal based on a data portion of the decoded output that originates from the data portions of the first and second decoded signals, and performing adaptive calibration on said channel compensator, said voltage regulator, said phase interpolator and said deskewers of said decoders to adjust the gain of said channel compensator, the magnitude of the reference voltage, the phase shift of each of the interpolated clock signals and the delay of each of the deskewed clock signals based on an error portion of the decoded output that originates from the error portions of the first decoded signals.

11. The receiver as claimed in claim 10, wherein, for each of said decoders:
said second demultiplexer includes a number (P) of sampling switches; and
each of said sampling switches has a first terminal that is connected to said buffer to receive the to-be-decoded data signal, and a second terminal that is connected to a respective one of said ADCs and that provides a respective one of the second demultiplexed data signals.

12. The receiver as claimed in claim 10, wherein each of said ADCs of said decoders is a successive approximation ADC.

13. The receiver as claimed in claim 10, wherein, for each of said decoders:
said first demultiplexer includes a sampling switch; and
said sampling switch has a first terminal that is connected to said channel compensator to receive the feed-in data signal, and a second terminal that is connected to said buffer and that provides the corresponding one of the first demultiplexed data signals.

14. The receiver as claimed in claim 10, wherein each of said decoders further includes:
a phase alignment circuit connected to said ADCs to receive the first and second decoded signals, and aligning the first and second decoded signals to generate an aligned signal containing a data portion that is (M×P)-bits wide and an error portion that is one-bit wide.

15. The receiver as claimed in claim 14, wherein each of said decoders further includes:

a 1:Q demultiplexer connected to said phase alignment circuit to receive the aligned signal, further connected to said adaptive controller, and demultiplexing the aligned signal into a demultiplexed signal containing a data portion that is (M×P×Q)-bits wide and an error portion that is Q-bits wide, where $Q \geq 2$;

the demultiplexed signals respectively generated by said 1:Q demultiplexers of said decoders cooperatively constituting the decoded output.

* * * * *